(12) United States Patent
Won

(10) Patent No.: US 11,258,040 B2
(45) Date of Patent: Feb. 22, 2022

(54) DISPLAY DEVICE

(71) Applicant: Samsung Display Co., LTD., Yongin-si (KR)

(72) Inventor: Chang Hee Won, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/688,851

(22) Filed: Nov. 19, 2019

(65) Prior Publication Data

US 2020/0328375 A1    Oct. 15, 2020

(30) Foreign Application Priority Data

Apr. 12, 2019  (KR) .................. 10-2019-0043293

(51) Int. Cl.
| | | |
|---|---|---|
| *H01L 51/52* | (2006.01) | |
| *H01L 51/56* | (2006.01) | |
| *H01L 27/32* | (2006.01) | |
| *H01L 51/00* | (2006.01) | |

(52) U.S. Cl.
CPC ........ *H01L 51/5253* (2013.01); *H01L 27/323* (2013.01); *H01L 27/3227* (2013.01); *H01L 27/3234* (2013.01); *H01L 27/3244* (2013.01); *H01L 51/0097* (2013.01); *H01L 51/5246* (2013.01); *H01L 51/5281* (2013.01); *H01L 51/56* (2013.01); *H01L 2251/5338* (2013.01)

(58) Field of Classification Search
CPC ............. H01L 51/5246; H01L 51/0097; H01L 51/428; H01L 51/50; H01L 51/5237; H01L 51/525; H01L 51/5253; H01L 51/5256; H01L 51/5284; H01L 51/5293; H01L 51/5296; G02F 1/0139; G02F 1/0311; G02F 1/133526; G02F 1/133528; G02F 2001/1335; G02F 2001/13356; G02F 2001/133562; G02F 2001/133565
See application file for complete search history.

(56) References Cited

U.S. PATENT DOCUMENTS

| | | | | |
|---|---|---|---|---|
| 8,823,042 | B2 * | 9/2014 | Kim ...................... | H05K 1/028 |
| | | | | 257/99 |
| 9,693,401 | B2 * | 6/2017 | Ho ....................... | H05B 33/02 |
| 10,418,537 | B1 * | 9/2019 | Lin ....................... | H01L 33/58 |
| 10,541,380 | B1 * | 1/2020 | Sung ................... | H01L 51/0097 |
| 10,606,399 | B2 * | 3/2020 | Kim ...................... | G06F 1/1637 |
| 10,629,658 | B1 * | 4/2020 | Zhang .................. | H01L 27/3246 |
| 10,868,088 | B2 * | 12/2020 | Bok ..................... | H01L 27/323 |
| 10,895,773 | B1 * | 1/2021 | Zhang ................ | G02F 1/133528 |

(Continued)

FOREIGN PATENT DOCUMENTS

| | | |
|---|---|---|
| JP | 201887863 | 6/2018 |
| KR | 1020170009644 | 1/2017 |

(Continued)

*Primary Examiner* — Maliheh Malek
(74) *Attorney, Agent, or Firm* — Cantor Colburn LLP

(57) ABSTRACT

A display device includes an active region and a non-active region. The display device includes a display panel and a polarizing member which is disposed on a surface of the display panel, where the display panel and the polarizing member include a first through hole which penetrates the display panel and the polarizing member in a thickness direction and a hole coating layer which is disposed on an inner wall of the polarizing member of the first through hole.

20 Claims, 18 Drawing Sheets

(56) References Cited

U.S. PATENT DOCUMENTS

| | | | |
|---|---|---|---|
| 10,911,851 B2* | 2/2021 | Noh | G06F 1/1637 |
| 11,011,595 B2* | 5/2021 | Lee | H01L 51/524 |
| 11,101,340 B2* | 8/2021 | Sung | H01L 27/3276 |
| 11,121,202 B2* | 9/2021 | Jang | H01L 27/3276 |
| 11,127,797 B2* | 9/2021 | Shin | G06F 1/1641 |
| 2004/0157652 A1* | 8/2004 | Yamazaki | H04M 1/0214 455/575.3 |
| 2006/0202615 A1* | 9/2006 | Murakami | H01L 51/5237 313/506 |
| 2008/0123029 A1* | 5/2008 | Ko | G02F 1/133512 349/96 |
| 2008/0227126 A1* | 9/2008 | Uematsu | G01N 33/54373 435/7.92 |
| 2011/0050657 A1* | 3/2011 | Yamada | H01L 51/5237 345/204 |
| 2011/0199348 A1* | 8/2011 | Takatani | H01L 27/3276 345/204 |
| 2014/0240856 A1* | 8/2014 | Allore | G06F 1/1637 359/811 |
| 2014/0247398 A1* | 9/2014 | Kakimoto | G02B 6/0055 348/729 |
| 2015/0015813 A1* | 1/2015 | Yoshinari | G03F 7/027 349/12 |
| 2016/0154271 A1* | 6/2016 | Kim | G06F 1/1643 349/58 |
| 2016/0168432 A1* | 6/2016 | You | C09J 133/08 359/893 |
| 2016/0179139 A1* | 6/2016 | Ahn | G06F 1/1686 361/679.3 |
| 2016/0242647 A1* | 8/2016 | Ishii | A61B 5/0042 |
| 2017/0237038 A1* | 8/2017 | Kim | H01L 51/5253 257/40 |
| 2017/0277313 A1* | 9/2017 | Lee | G06F 3/0412 |
| 2018/0011015 A1* | 1/2018 | Ishii | A61B 5/0075 |
| 2018/0031751 A1* | 2/2018 | Sugiyama | G02B 6/0051 |
| 2018/0129102 A1* | 5/2018 | Murakami | G02F 1/133608 |
| 2018/0151641 A1* | 5/2018 | Choo | G06F 1/1643 |
| 2018/0225503 A1* | 8/2018 | Kim | G06K 9/00046 |
| 2018/0262602 A1* | 9/2018 | Zhang | H04R 9/06 |
| 2019/0051858 A1* | 2/2019 | Tomioka | G02F 1/1345 |
| 2019/0103416 A1* | 4/2019 | Nakaie | H01L 51/0097 |
| 2019/0115370 A1* | 4/2019 | Fu | H01L 27/127 |
| 2019/0129232 A1* | 5/2019 | Itagaki | G02F 1/133308 |
| 2019/0129257 A1* | 5/2019 | Wang | G02F 1/133514 |
| 2019/0130822 A1* | 5/2019 | Jung | G09G 3/3208 |
| 2019/0137815 A1* | 5/2019 | Kim | H01L 51/5092 |
| 2019/0219862 A1* | 7/2019 | Yoshida | G02F 1/133308 |
| 2019/0278132 A1* | 9/2019 | Nakamura | G02F 1/133528 |
| 2019/0306295 A1* | 10/2019 | Cheng | H04M 1/03 |
| 2019/0369422 A1* | 12/2019 | Zeng | G06F 1/3265 |
| 2019/0384121 A1* | 12/2019 | Nishiwaki | G02F 1/133514 |
| 2020/0020752 A1* | 1/2020 | Shi | H01L 51/5253 |
| 2020/0057475 A1* | 2/2020 | Ahn | H04R 17/00 |
| 2020/0057503 A1* | 2/2020 | Seomoon | G06F 3/0416 |
| 2020/0057522 A1* | 2/2020 | Hong | G06F 3/041 |
| 2020/0057523 A1* | 2/2020 | Park | G06F 3/0412 |
| 2020/0058711 A1* | 2/2020 | Seomoon | H05K 1/147 |
| 2020/0058712 A1* | 2/2020 | Lee | H05K 1/147 |
| 2020/0093016 A1* | 3/2020 | Yee | G06F 1/1656 |
| 2020/0105826 A1* | 4/2020 | Kim | H01L 25/0753 |
| 2020/0105853 A1* | 4/2020 | Kwon | H01L 27/3272 |
| 2020/0117034 A1* | 4/2020 | Yin | G06F 1/1643 |
| 2020/0136085 A1* | 4/2020 | Wang | H01L 51/0097 |
| 2020/0142242 A1* | 5/2020 | Kikuchi | G02F 1/133528 |
| 2020/0152895 A1* | 5/2020 | Zhu | H01L 25/18 |
| 2020/0159350 A1* | 5/2020 | Yang | G06F 3/044 |
| 2020/0159358 A1* | 5/2020 | Hong | G06F 3/0414 |
| 2020/0160775 A1* | 5/2020 | Zhang | H01L 27/3232 |
| 2020/0166789 A1* | 5/2020 | Yu | H04M 1/0266 |
| 2020/0168671 A1* | 5/2020 | Jang | G06F 3/04164 |
| 2020/0174301 A1* | 6/2020 | Tien | H04N 5/2257 |
| 2020/0174310 A1* | 6/2020 | Pan | G02B 6/0081 |
| 2020/0183220 A1* | 6/2020 | Ochi | G02B 6/0088 |
| 2020/0185466 A1* | 6/2020 | Xiang | H01L 51/5253 |
| 2020/0185643 A1* | 6/2020 | Moon | G02F 1/1339 |
| 2020/0186688 A1* | 6/2020 | Chen | G02F 1/133514 |
| 2020/0194714 A1* | 6/2020 | Won | H01L 27/3225 |
| 2020/0201105 A1* | 6/2020 | Cheng | G02F 1/133606 |
| 2020/0357838 A1* | 11/2020 | Fukuyama | G02B 3/04 |
| 2020/0401185 A1* | 12/2020 | Won | G06F 1/1637 |
| 2021/0103353 A1* | 4/2021 | Park | G06F 3/0412 |
| 2021/0200366 A1* | 7/2021 | Bok | H01L 31/1055 |

FOREIGN PATENT DOCUMENTS

| | | |
|---|---|---|
| KR | 1020180046960 | 5/2018 |
| KR | 1020180063962 | 6/2018 |

* cited by examiner

DISPLAY DEVICE

This application claims priority to Korean Patent Application No. 10-2019-0043293, filed on Apr. 12, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

Electronic devices that provide images to a user, such as smartphones, tablet personal computers ("PCs"), digital cameras, notebook computers, navigation devices and smart televisions, include a display device for displaying images.

The display device includes a display panel and components for driving the display panel. Recently, components for implementing various functions other than screen display are also being added to the display device. One example of the above-described display device is a smartphone equipped with optical elements such as a camera and an infrared sensor.

The display device may include an optical hole in order for light reception of an optical element. To increase the transmittance of the optical hole, some members of the display device are physically penetrated. A region around a physically penetrating through hole may be exposed to outside air such as moisture.

SUMMARY

Among members constituting a display device, there are members that deteriorate when exposed to moisture. A polarizing film may shrink when moisture permeates into the polarizing film, for example. The shrinkage of the polarizing film may cause an appearance defect.

Exemplary embodiments of the invention provide a display device capable of preventing permeation of moisture through a through hole.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of a display device includes an active region and a non-active region, and the display device includes a display panel, and a polarizing member which is disposed on a first surface of the display panel, where a first through hole which penetrates the display panel and the polarizing member in a thickness direction is defined in the display panel and the polarizing member and the display panel and the polarizing member include a hole coating layer which is disposed on an inner wall of the polarizing member of the first through hole.

An exemplary embodiment of a display device includes a hole region disposed within an active region, and the display device includes a display panel which includes a flexible substrate, an active element layer disposed on the flexible substrate and including light emitting elements, and a thin-film encapsulation layer disposed on the active element layer, a polarizing bonding layer which is disposed on the thin-film encapsulation layer of the display panel, a polarizing film which is disposed on the polarizing bonding layer, a transparent bonding layer which is disposed on the polarizing film, and a window member which is disposed on the transparent bonding layer and includes a window base and a print layer disposed on the window base, where a first through hole which penetrates the flexible substrate, the active element layer, the thin-film encapsulation layer, the polarizing bonding layer and the polarizing film in a thickness direction is defined in the hole region, the hole region includes a hole coating layer which is disposed on an inner wall of the first through hole, a second through hole which penetrates the transparent bonding layer in the thickness direction and overlaps the first through hole is defined in the hole region, and an optical hole is defined by the print layer and overlaps the first through hole and the second through hole.

In an exemplary embodiment of a display device, a through hole is covered with a hole coating layer to prevent moisture from permeating toward a polarizing member through the through hole. Therefore, it is possible to prevent a shrinkage defect of the polarizing member due to exposure to moisture and the resultant appearance defect.

However, the effects of the exemplary embodiments are not restricted to the one set forth herein. The above and other effects of the exemplary embodiments will become more apparent to one of daily skill in the art to which the exemplary embodiments pertain by referencing the claims.

Other features and exemplary embodiments may be apparent from the following detailed description, the drawings, and the claims.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
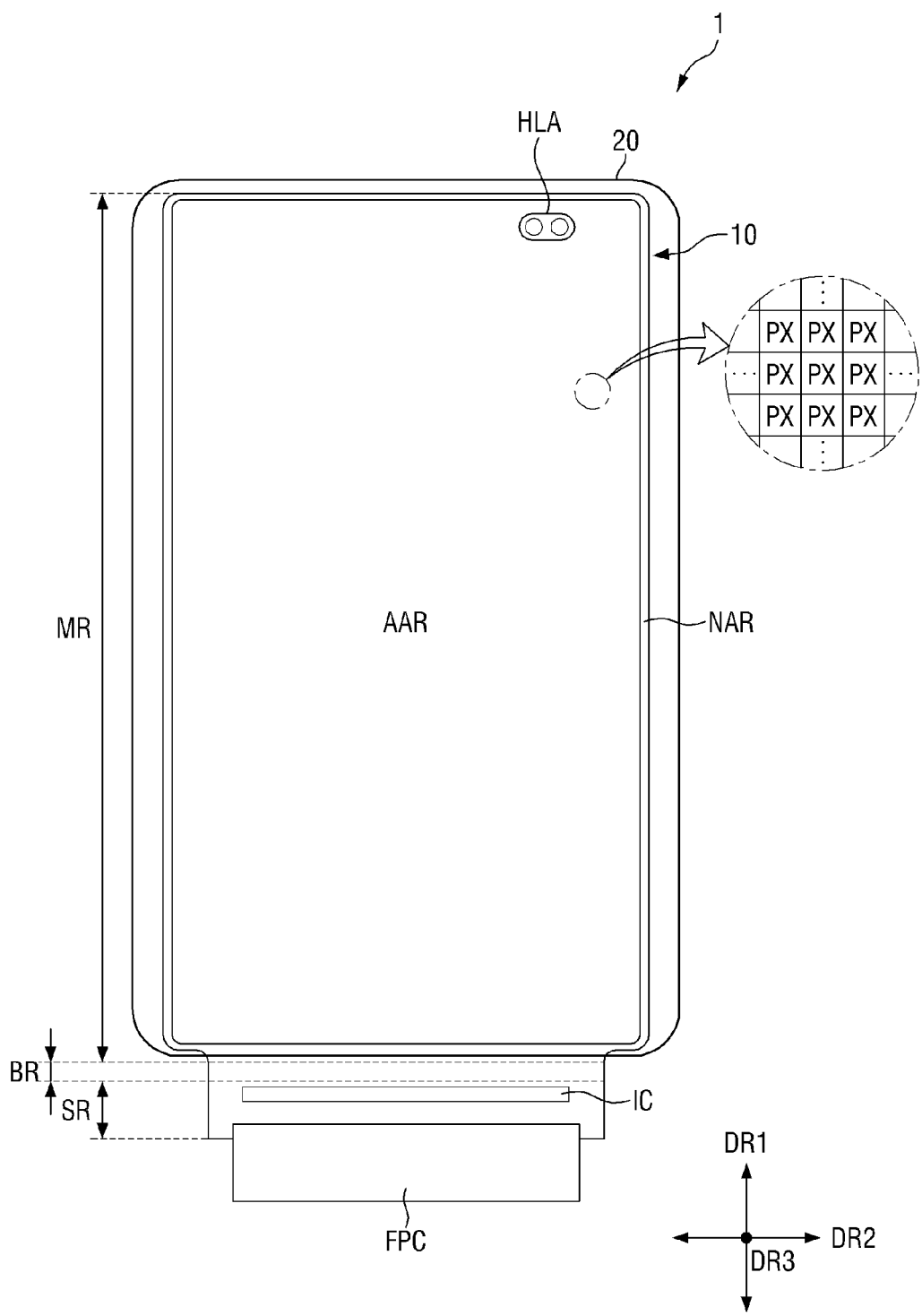
FIG. 1 is a plan view of an exemplary embodiment of a display device.

The invention will now be described more fully hereinafter with reference to the accompanying drawings, in which preferred embodiments of the invention are shown. This invention may, however, be embodied in different forms and should not be construed as limited to the exemplary embodiments set forth herein. Rather, these exemplary embodiments are provided so that this invention will be thorough and complete, and will filly convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

Hereinafter, specific embodiments will be described with reference to the attached drawings.

FIG. 1 is a plan view of an exemplary embodiment of a display device 1. In exemplary embodiments, a first direction DR1 and a second direction DR2 are different directions intersecting each other, for example, directions perpendicularly intersecting each other in a plan view. A third direction DR3 is a direction intersecting a plane in which the first direction DR1 and the second direction DR2 lie, for example, a direction perpendicularly intersecting both the first direction DR1 and the second direction DR2. In the drawings, the first direction DR1 indicates a vertical direction of the display device 1, the second direction DR2 indicates a horizontal direction of the display device 1, and the third direction DR3 indicates a thickness direction of the display device 1. In the following embodiments, one side in the first direction DR1 refers to an upward direction in a plan view, the other side in the first direction DR1 refers to a downward direction in a plan view, one side in the second direction DR2 refers to a right direction in a plan view, the other side in the second direction DR2 refers to a left direction in a plan view, one side in the third direction DR3 refers to an upward direction in cross-sectional view, and the other side in the third direction DR3 refers to a downward direction in cross-sectional view. However, directions mentioned in exemplary embodiments should be understood as relative directions, and the exemplary embodiments are not limited to the mentioned directions.

Referring to FIG. 1, the display device 1 displays moving images or still images. A display direction of a main screen may be the one side in the third direction DR3 (e.g., a top emission display device), but may also be the other side in the third direction DR3 (e.g., a bottom emission display device) or both the one side and the other side in the third direction DR3 (e.g., a double-sided emission display device or a transparent display device).

The display device 1 may refer to any electronic device that provides a display screen. Examples of the display device 1 may include portable electronic devices that provide a display screen, such as a mobile phone, a smartphone, a tablet personal computer ("PC"), an electronic watch, a smart watch, a watch phone, a mobile communication terminal, an electronic notebook, an electronic book, a portable multimedia player ("PMP"), a navigation device, a game machine and a digital camera, as well as a television, a notebook computer, a monitor, a billboard and the Internet of things.

The display device 1 includes an active region AAR and a non-active region NAR. In the display device 1, a portion in which a screen is displayed may be defined as a display region, and a portion in which no screen is displayed may be defined as a non-display region. In this case, the display region may be included in the active region AAR. When the display device 1 has a touch function, a touch region in which a touch input is sensed may also be included in the active region AAR. The display region and the touch region may overlap each other. That is, the active region AAR may be a region where a screen is displayed and a touch input is sensed.

The active region AAR may include a plurality of pixels PX. The pixels PX may be arranged in a matrix direction. Each of the pixels PX may be rectangular or square in a plan view (that is, when seen from above). However, the planar shape of each of the pixels PX is not limited to the above examples and may also have various other shapes such as a rhombic shape including each side inclined with respect to the first direction DR1. Each of the pixels PX may include a light emitting region EMA (refer to FIG. 6) and a non-light emitting region NEM (refer to FIG. 6). The non-light emitting region NEM may be provided in a lattice shape or a mesh shape in a plan view and may surround the light emitting regions EMA.

The active region AAR may be shaped like a rectangle or a rectangle with rounded corners. The active region AAR illustrated in the drawings is shaped like a rectangle that includes rounded corners and is longer in the first direction DR1 than in the second direction DR2. However, the shape of the active region AAR is not limited to this shape, and the active region AAR may have various shapes such as a rectangle that is longer in the second direction DR2 than in the first direction DR1, a square or other polygons, a circle, and an ellipse.

The non-active region NAR is disposed around the active region AAR. The non-active region NAR may be a bezel region. The non-active region NAR may overlap a print layer 22 of a window member 20 to be described later.

The non-active region NAR may surround all sides (four sides in the drawings) of the active region AAR. However, the invention is not limited to this case. In an exemplary embodiment, the non-active region NAR may not be disposed around an upper side of the active region AAR, for example.

In the non-active region NAR, signal wirings or driving circuits for transmitting signals to the active region AAR (the display region or the touch region) may be disposed. The non-active region NAR may not include the display region. Further, the non-active region NAR may not include the touch region. In an exemplary embodiment, the non-active region NAR may include a portion of the touch region, and a sensor member such as a pressure sensor may be disposed in the portion. In some exemplary embodiments, the active region AAR may be exactly the same as the display region where a screen is displayed, and the non-active region NAR may be exactly the same as the non-display region where no screen is displayed.

The display device 1 may further include a hole region HLA including at least one hole HLE. The hole region HLA will be described in detail later.

Figure 2:
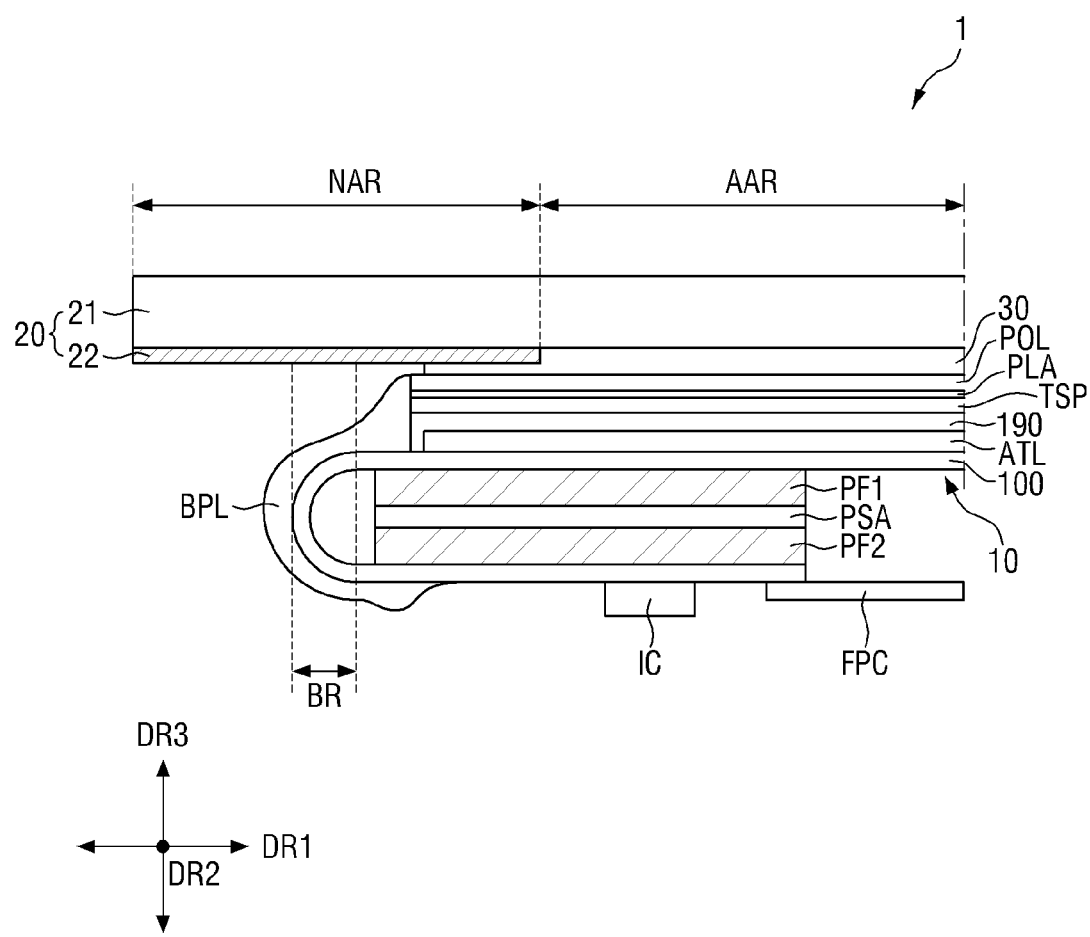
FIG. 2 is a schematic cross-sectional view around the exemplary embodiment of a bending region of the display device.

FIG. 2 is a schematic cross-sectional view around the exemplary embodiment of a bending region BR of the display device 1. FIG. 2 schematically illustrates a cross-section of the display device 1, and the detailed cross-sectional structure of the display device 1 will be described in detail later with reference to FIG. 6.

Referring to FIGS. 1 and 2, the display device 1 includes a display panel 10 that provides a display screen. Examples of the display panel 10 include an organic light emitting display panel, a micro light emitting diode ("LED") display panel, a nano LED display panel, a quantum dot light emitting display panel, a liquid crystal display panel, a plasma display panel, a field emission display panel, an electrophoretic display panel, and an electrowetting display panel. A case where an organic light emitting display panel is applied as an example of the display panel 10 will be described below, but the invention is not limited to this case, and other display panels may also be applied as long as the same technical spirit is applicable.

The display device 1 may further include a touch member that senses a touch input. The touch member may be integrated into the display panel 10 in the form of a touch layer TSP as exemplified in the following embodiments. However, the invention is not limited to this case, and the touch member may also be provided as a separate member from the display panel 10 in the form of a touch panel or a touch film and then attached onto the display panel 10.

In an exemplary embodiment, the display panel 10 may include a flexible substrate 100 including a flexible polymer material such as polyimide. Accordingly, the display panel 10 may be deformable, e.g., bent, curved, folded, or rolled.

The display panel 10 may include the bending region BR where the display panel 10 is bent. The display panel 10 may be divided into a main region MR located on a side of the bending region BR and a sub region SR located on the other side of the bending region BR.

The display region of the display panel 10 is disposed in the main region MR. In an exemplary embodiment, an edge portion around the display region in the main region MR, the whole of the bending region BR, and the whole of the sub region SR may be the non-display region. However, the bending region BR and/or the sub region SR may also include the display region.

The shape of the main region MR may be substantially similar to the planar shape of the display device 1. The main region MR may be a flat region located in one plane. However, the invention is not limited to this case, and at least one of edges of the main region MR excluding an edge (side) connected to the bending region BR may also be curved or may be bent perpendicularly.

If at least one of the edges of the main region MR excluding the edge (side) connected to the bending region BR is curved or bent, the display region may also be disposed at the curved or bent edge. However, the invention is not limited to this case, and the curved or bent edge may also be the non-display region where no screen is displayed or may include a combination of the display region and the non-display region.

An active element layer ATL, a thin-film encapsulation layer 190 and the touch layer TSP may be disposed on one surface of the substrate 100 in the main region MR. In FIG. 2, the active element layer ATL, the thin-film encapsulation layer 190 and the touch layer TSP are schematically illustrated for ease of description. The more detailed cross-sectional structure of these elements will be described later with reference to FIG. 6.

The active element layer ATL may include light emitting elements and thin-film transistors ("TFTs") for driving the light emitting elements. The thin-film encapsulation layer 190 may cover the active element layer ATL to prevent the active element layer ATL from being exposed to moisture or air. The touch layer TSP may be disposed on the thin-film encapsulation layer 190. The touch layer TSP may include a plurality of touch electrodes. The touch electrodes may be provided in a mesh shape. In another exemplary embodiment, the touch layer TSP may be omitted.

The display device 1 may further include a polarizing member POL disposed on the display panel 10. The polarizing member POL polarizes light that passes therethrough. The polarizing member POL may reduce reflection of external light. The polarizing member POL may be attached onto the touch layer TSP by a polarizing bonding layer PLA. When the touch layer TSP is omitted, the polarizing member POL may be attached onto the thin-film encapsulation layer 190.

The polarizing member POL may be disposed in the main region MR and, in some cases, may be further disposed in the bending region BR or the sub region SR. In another exemplary embodiment, the polarizing member POL may be omitted.

Although not illustrated, a cover panel may be disposed on other surface of the substrate 100. In an exemplary embodiment, the cover panel may include a heat dissipation layer, a cushion layer, etc., for example.

The bending region BR is connected to other side of the main region MR in the first direction DR1. In an exemplary embodiment, the bending region BR may be connected to a lower short side of the main region MR, for example. The width of the bending region BR may be smaller than the width of (the short side of) the main region MR. A connection portion between the main region MR and the bending region BR may have an L-cut shape.

In the bending region BR, the display panel 10 may be bent with a curvature toward the other side in the third direction DR3. The bending region BR may have a constant radius of curvature. However, the invention is not limited to this case, and the bending region BR may also have a different radius of curvature in each section. As the display panel 10 is bent in the bending region BR, a surface of the display panel 10 may be reversed. That is, a surface of the display panel 10 which faces upward may be changed to face outward through the bending region BR and then to face downward.

A bending protection layer BPL may be disposed in the bending region BR. The bending protection layer BPL may be disposed on the one surface of the substrate 100. The bending protection layer BPL may include, e.g., resin to protect the bending region BR. The bending protection layer BPL may be disposed to overlap not only the bending region BR but also a portion of the main region MR and a portion of the sub region SR adjacent to the bending region BR.

The sub region SR extends from the bending region BR. The sub region SR may extend parallel to the main region MR after the completion of bending. The sub region SR may overlap the main region MR in the third direction DR3, that is, in the thickness direction of the display panel 10. The width of the sub region SR (in the second direction DR2) may be, but not necessarily, the same as the width of the bending region BR.

A driver chip IC may be disposed in the sub region SR. The driver chip IC may include an integrated circuit for driving the display panel 10. The integrated circuit may include an integrated circuit for a display and/or an integrated circuit for a touch member. The integrated circuit for a display and the integrated circuit for a touch member may be provided as separate chips or may be integrated into one chip. The driver chip IC may be disposed on a driving substrate FPC or another external printed circuit board ("PCB") connected to the driving substrate FPC.

A pad portion may be disposed at an end of the sub region SR of the display panel 10. The pad portion may include a plurality of display signal wiring pads and a plurality of touch signal wiring pads. The driving substrate FPC may be connected to the pad portion at the end of the sub region SR of the display panel 10. The driving substrate FPC may be a flexible PCB ("FPCB") or film.

The display panel 10 may further include protective films PF1 and PF2 disposed in an overlap region between the main region MR and the sub region SR. In an exemplary embodiment, a first protective film PF1 may be attached to the other surface of the substrate 100 in the main region MR, and a second protective film PF2 may be attached to the other surface of the substrate 100 in the sub region SR, for example. The first protective film PF1 and the second protective film PF2 may face each other and may be bonded together by a bonding layer PSA such as an adhesive or a gluing agent. Accordingly, the mechanical stability of the bending structure may be improved.

The display device 1 may further include the window member 20. The window member 20 may cover and protect the display panel 10. The window member 20 may be attached onto a surface of the display panel 10 by a transparent bonding layer 30 including an optical clear adhesive or an optical clear resin. When the display device 1 includes the polarizing member POL, the window member 20 may be attached onto a surface of the polarizing member POL.

The window member 20 may include a window base 21 and the print layer 22 disposed on the window base 21.

The window base 21 may include a transparent material. In an exemplary embodiment, the window base 21 may include, for example, glass or plastic. When the window base 21 includes plastic, it may have flexible properties.

Examples of plastic applicable to the window base 21 include, but are not limited to, polyimide, polyacrylate, polymethyl methacrylate ("PMMA"), polycarbonate ("PC"), polyethylene naphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, triacetyl cellulose ("TAC"), and cellulose acetate propionate ("CAP").

The planar shape of the window base 21 corresponds to the shape of the display device 1 to which the window base 21 is applied. In an exemplary embodiment, when the display device 1 is substantially rectangular in a plan view, the window base 21 may also be substantially rectangular, for example. In another exemplary embodiment, when the display device 1 is circular, the window base 21 may also be circular.

The window base 21 may be larger than the display panel 10 in a plan view, and its side surfaces may protrude from side surfaces of the display panel 10. The window base 21 may protrude outward from all sides (four sides in the drawings) of the display panel 10.

The print layer 22 may be disposed on the window base 21. The print layer 22 may be disposed on a surface and/or the other surface of the window base 21. The print layer 22 may be disposed on an edge portion of the window base 21 and disposed in the non-active region NAR. In addition, the print layer 22 may be disposed in the hole region HLA. The print layer 22 may be a light shielding layer or a decorative layer for aesthetic purposes.

Figure 3:
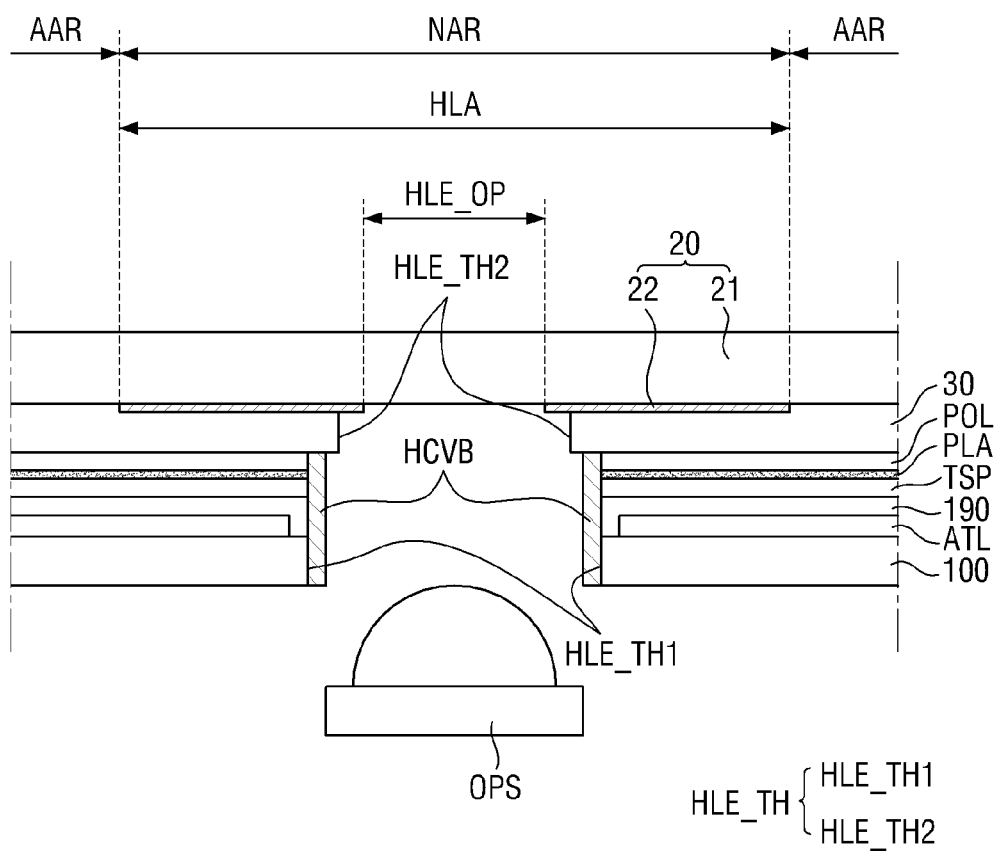
FIG. 3 is a cross-sectional view around the exemplary embodiment of a hole region of the display device.
Figure 4:
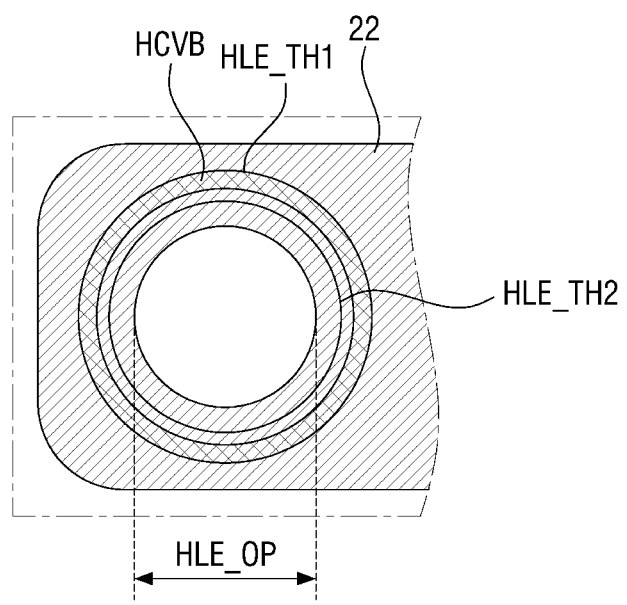
FIG. 4 is a plan view illustrating the planar positional relationship between members around the hole region.

The hole region HLA of the display device 1 will now be described in detail. FIG. 3 is a cross-sectional view around the exemplary embodiment of the hole region HLA of the display device 1. FIG. 4 is a plan view illustrating the planar positional relationship between members around the hole region HLA.

Referring to FIGS. 1 through 4, the hole region HLA may be disposed on one side of the display device 1 in the first direction DR1. The hole region HLA itself may be the non-active region NAR where display and/or touch is not performed. The hole region HLA may be disposed inside the active region AAR. That is, the hole region HLA may be surrounded by the active region AAR as illustrated in FIG. 1. In another example, the hole region HLA may be surrounded by the non-active region NAR or may be disposed around a boundary between the active region AAR and the non-active region NAR such that a portion of the hole region HLA is surrounded by the active region AAR and the other portion is surrounded by the non-active region NAR.

The hole region HLA may be shaped like a circle, an ellipse, a dumbbell, or a rectangle with convex short sides in a plan view. However, the shape of the hole region HLA is not limited to these examples and may be changed to various shapes such as a rectangle, a square and other polygons.

At least one hole HLE may be defined in the hole region HLA. In an exemplary embodiment, the hole HLE may be, but is not limited to, circular or elliptical, for example.

The hole HLE may include a physically penetrating through hole HLE_TH. The through hole HLE_TH may include a first through hole HLE_TH1 which physically penetrates the display panel 10 and the polarizing member POL. In addition, the through hole HLE_TH may further include a second through hole HLE_TH2 which penetrates the transparent bonding layer 30. As the above members are removed from the through hole HLE_TH, light transmittance in this region may be improved. The second through hole HLE_TH2 of the transparent bonding layer 30 may completely overlap the first through hole HLE_TH1. An inner diameter of the second through hole HLE_TH2 may be smaller than an inner diameter of the first through hole HLE_TH1 of a laminate of the display panel 10 and the polarizing member POL. In a plan view, the second through hole HLE_TH2 may be located inside the first through hole HLE_TH1. An inner wall of the second through hole HLE_TH2 may protrude inward from an inner wall of the first through hole HLE_TH1. Further, the inner wall of the second through hole HLE_TH2 may protrude inward from a hole coating layer HCVB to be described later. However, the invention is not limited to this case. The second through hole HLE_TH2 of the transparent bonding layer 30 may also have the same inner diameter as the first through hole HLE_TH1, and the inner wall of the second through hole HLE_TH2 may also be aligned with the inner wall of the first through hole HLE_TH1. In addition, a portion of the second through hole HLE_TH2 of the transparent bonding layer 30 may be located outside the first through hole HLE_TH1.

The window member 20 may not be physically penetrated in a region overlapping the through hole HLE_TH. Since the window base 21 of the window member 20 itself has high light transmittance, high light transmittance may be maintained although the window member 20 is not penetrated. In addition, since the window member 20 physically covers the region without being penetrated, it may protect members disposed under the window member 20.

An optical hole HLE_OP which is an optical light transmitting window may be defined in the hole region HLA, in addition to the through hole HLE_TH. The optical hole HLE_OP may overlap the through hole HLE_TH and may be defined by a pattern of the print layer 22 of the window member 20. The print layer 22 may be disposed in a part of the hole region HLA to prevent light of pixels PX from being output (e.g., leakage of light) through the through hole HLE_TH. The print layer 22 may extend up to the outer periphery of the hole region HLA, but the invention is not limited to this case.

The print layer 22 is disposed around the through hole HLE_TH and exposes at least a portion of the through hole HLE_TH. A region of the through hole HLE_TH exposed by the print layer 22 may be the optical hole HLE_OP through which light is transmitted. In an exemplary embodiment, the print layer 22 of the hole region HLA may partially overlap the through hole HLE_TH. That is, an inner side surface of the print layer 22 may protrude inward from an inner wall of the through hole HLE_TH.

When the through hole HLE_TH is circular in a plan view, a region in which the through hole HLE_TH and the print layer 22 overlap each other may be donut-shaped. However, the invention is not limited to this case, and an inner wall of the print layer 22 of the hole region HLA may also be aligned with an inner wall of the through hole HLE_TH which has a minimum radius or may be located outside the inner wall of the through hole HLE_TH such that the through hole HLE_TH and the print layer 22 do not overlap each other. Even when the inner wall of the print layer 22 of the hole region HLA is located outside the inner wall of the through hole HLE_TH, when a coating layer having a light shielding function is disposed on the inner wall of the through hole HLE_TH, the leakage of light through the region may be prevented.

The display device 1 may further include an optical element OPS including a light receiving portion. Examples of the optical element OPS including the light receiving portion may include a camera, a lens (a condensing lens, a light guide lens, etc.), and optical sensors such as an infrared sensor, an iris recognition sensor and an illuminance sensor. The optical element OPS may be disposed on the other surface side of the display panel 10 to overlap the hole region HLA. At least a part of the light receiving portion of the optical element OPS may be located inside the optical hole HLE_OP. Light outside the display device 1 may pass through the window base 21 surrounded by the print layer 22 and enter the light receiving portion through the through hole HLE_TH disposed under the window base 21. When the window base 21 has high light transmittance as described above, external light may reach the light receiving portion of the optical element OPS through the above optical path without a large loss.

The hole coating layer HCVB (or a hole cover layer) may be disposed on the inner wall of the first through hole HLE_TH1 of the hole region HLA. The hole coating layer HCVB may cover the entire inner wall of the first through hole HLE_TH1 of the display panel 10 and the polarizing member POL. The hole coating layer HCVB may overlap the print layer 22, and the inner side surface of the print layer 22 may protrude inward from the hole coating layer HCVB.

The hole coating layer HCVB may include a resin having water resistance and chemical resistance. When moisture permeates into the polarizing member POL, the polarizing member POL may discolor, and a local shrinkage defect may occur around the first through hole HLE_TH1. Thus, an appearance defect may be detected in the entire hole region HLA. However, when the hole coating layer HCVB having water resistance and chemical resistance is disposed on the inner wall of the first through hole HLE_TH1 as in the exemplary embodiment, a path through which moisture may permeate into the polarizing member POL may be blocked. Accordingly, the above defect of the hole region HLA may be prevented. In addition, since the hole coating layer HCVB blocks moisture or the like from permeating into the display panel 10 through the first through hole HLE_TH1, degradation of an organic layer (an organic light emitting layer) of the display panel 10 due to moisture may be prevented. The hole coating layer HCVB may not be disposed on the inner wall of the second through hole HLE_TH2.

The hole coating layer HCVB may include black resin including a black dye or a black pigment. When the hole coating layer HCVB includes the black resin, the leakage of light through the hole region HLA may be prevented. In addition, even when the inner wall of the first through hole HLE_TH1 is not completely covered by the print layer 22 of the hole region HLA due to an alignment error or according to an intended design, the leakage of light through the first through hole HLE_TH1 may be effectively blocked.

In an exemplary embodiment, the hole coating layer HCVB may have a uniform thickness along an outer circumference of the first through hole HLE_TH1. In addition, the hole coating layer HCVB may have a uniform thickness in the thickness direction.

Next, the pixel circuit and the detailed cross-sectional structure of the display device 1 described above will be described.

Figure 5:
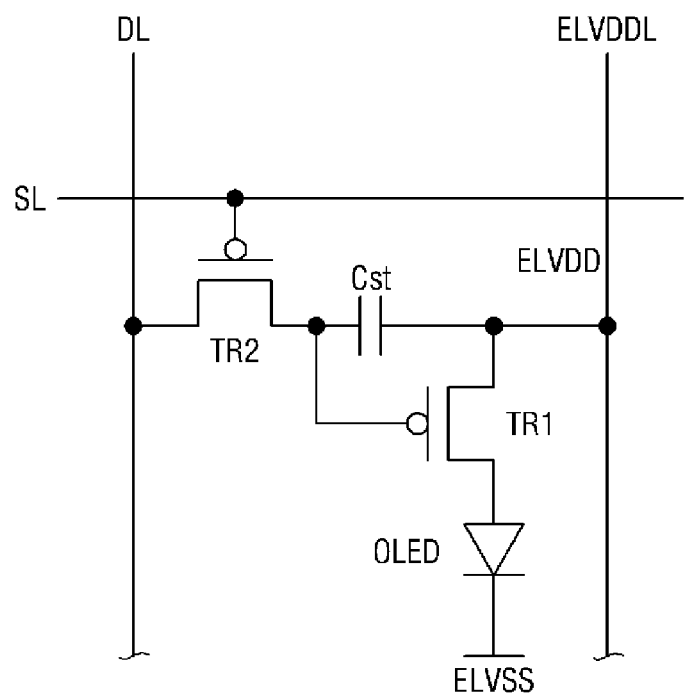
FIG. 5 is a circuit diagram of the exemplary embodiment of one pixel of the display device.

FIG. 5 is a circuit diagram of the exemplary embodiment of one pixel PX of the display device 1.

Referring to FIG. 5, a pixel circuit may include a first transistor TR1, a second transistor TR2, a capacitor Cst, and an organic light emitting diode OLED. Each pixel circuit is connected to a scan line SL, a data line DL, and a first power supply voltage line ELVDDL.

The first transistor TR1 may be a driving transistor, and the second transistor TR2 may be a switching transistor. Although the first transistor TR1 and the second transistor TR2 are all p-channel metal oxide semiconductor ("PMOS") transistors in the drawing, any one or both of the first transistor TR1 and the second transistor TR2 may also be an re-channel metal oxide semiconductor ("NMOS") transistor.

A first electrode (source electrode) of the first transistor TR1 is connected to the first power supply voltage line ELVDDL, and a second electrode (drain electrode) of the first transistor TR1 is connected to an anode of the organic light emitting diode OLED. A first electrode (source electrode) of the second transistor TR2 is connected to the data line DL, and a second electrode (drain electrode) of the second transistor TR2 is connected to a gate electrode of the first transistor TR1. The capacitor Cst is connected between the gate electrode and the first electrode of the first transistor TR1. A cathode of the organic light emitting diode OLED receives a second power supply voltage ELVSS. The second power supply voltage ELVSS may be lower than a first power supply voltage ELVDD provided by the first power supply voltage line ELVDDL.

The second transistor TR2 may output a data signal transmitted to the data line DL in response to a scan signal transmitted to the scan line GL. The capacitor Cst may be charged with a voltage corresponding to the data signal received from the second transistor TR2. The first transistor TR1 may control a driving current flowing through the organic light emitting diode OLED according to the amount of charge stored in the capacitor Cst.

The equivalent circuit of FIG. 5 is merely one example, and the pixel circuit may also include a greater number (e.g., seven) of transistors and capacitors.

Figure 6:
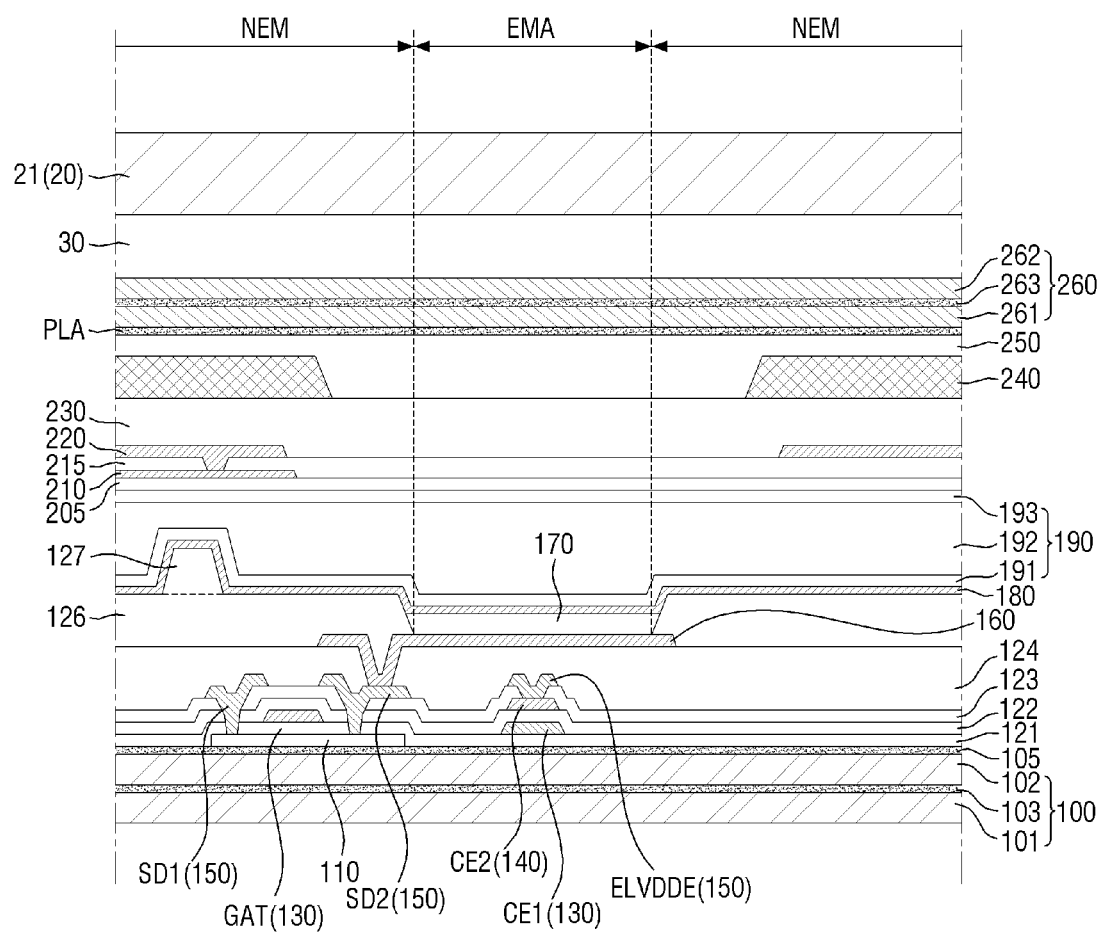
FIG. 6 is a cross-sectional view of the exemplary embodiment of one pixel of the display device.

FIG. 6 is a cross-sectional view of the exemplary embodiment of one pixel PX of the display device 1.

Referring to FIG. 6, the thin-film element layer ATL of the display panel 10 of the display device 1 may include the substrate 100, a buffer layer 105, a semiconductor layer 110, a first insulating layer 121, a first gate conductive layer 130, a second insulating layer 122, a second gate conductive layer 140, a third insulating layer 123, a data conductive layer 150, a fourth insulating layer 124, an anode 160, a bank layer 126 including an opening that exposes the anode 160, a light emitting layer 170 disposed in the opening of the bank layer 126, and a cathode 180 disposed on the light emitting layer 170 and the bank layer 126. Each of the above layers may be a single layer or a stack of a plurality of layers. Another layer may also be disposed between the above layers.

The substrate 100 supports each layer disposed on the substrate 100. The substrate 100 may include an insulating material such as polymer resin. In an exemplary embodiment, the polymer material may be, for example, polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide polycarbonate ("PC"), cellulose triacetate ("CAT"). cellulose acetate propionate ("CAP"), or a combination of these materials. In an exemplary embodiment, the substrate 100 may also include an inorganic material such as glass or quartz.

In an exemplary embodiment, the substrate 100 may include a plurality of sub-substrates 101 and 102. In an exemplary embodiment, the substrate 100 may include a first sub-substrate 101 and a second sub-substrate 102 stacked in the thickness direction, for example. Each of the first sub-substrate 101 and the second sub-substrate 102 may be a flexible substrate including, e.g., polyimide. The substrate 100 may further include a barrier layer 103 disposed between the first sub-substrate 101 and the second sub-substrate 102. In an exemplary embodiment, the barrier layer 103 may include silicon nitride, silicon oxide, or silicon oxynitride, for example. Although not illustrated, a barrier layer may also be disposed on the second sub-substrate 102.

The buffer layer 105 is disposed on the substrate 100. In an exemplary embodiment, the buffer layer 105 may include silicon nitride, silicon oxide, or silicon oxynitride, for example.

The semiconductor layer 110 is disposed on the buffer layer 105. The semiconductor layer 110 forms a channel of a TFT of the pixel PX. The semiconductor layer 110 may include polycrystalline silicon. However, the material of the semiconductor layer 110 is not limited to polycrystalline silicon, and the semiconductor layer 110 may also include monocrystalline silicon, low-temperature polycrystalline silicon, amorphous silicon, or an oxide semiconductor. Examples of the oxide semiconductor may include a binary compound (ABx), a ternary compound (ABxCy) and a quaternary compound (ABxCyDz) including indium, zinc, gallium, tin, titanium, aluminum, hafnium (Hf), zirconium (Zr), magnesium (Mg), etc.

The first insulating layer 121 is disposed on the semiconductor layer 110. The first insulating layer 121 may be a gate insulating film having a gate insulating function. The first insulating layer 121 may include a silicon compound, a metal oxide, or the like. In an exemplary embodiment, the first insulating layer 121 may include silicon oxide, silicon nitride, silicon oxynitride, aluminum oxide, tantalum oxide, hafnium oxide, zirconium oxide, titanium oxide, etc., for example.

The first gate conductive layer 130 is disposed on the first insulating layer 121. The first gate conductive layer 130 may include a gate electrode GAT of the TFT of the pixel PX, a scan line connected to the gate electrode GAT, and a storage capacitor first electrode CE1.

In an exemplary embodiment, the first gate conductive layer 130 may include one or more metals including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr) calcium (Ca), titanium (Ti), tantalum (Ta), tungsten (W) and copper (Cu), for example.

The second insulating layer 122 may be disposed on the first gate conductive layer 130. The second insulating layer 122 may be an interlayer insulating film or a second gate insulating film. In an exemplary embodiment, the second insulating layer 122 may include an inorganic insulating material such as silicon oxide, silicon nitride, silicon oxynitride, hafnium oxide, aluminum oxide, titanium oxide, tantalum oxide or zinc oxide.

The second gate conductive layer 140 is disposed on the second insulating layer 122. The second gate conductive layer 140 may include a storage capacitor second electrode CE2. In an exemplary embodiment, the second gate conductive layer 140 may include one or more metals including at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), for example. The second gate conductive layer 140 may include, but not limited to, the same material as that of the first gate conductive layer 130.

The third insulating layer 123 is disposed on the second gate conductive layer 140. The third insulating layer 123 may be an interlayer insulating film. In an exemplary embodiment, the third insulating layer 123 may include an inorganic insulating material such as silicon oxide, silicon nitride, silicon oxynitride, hafnium oxide, aluminum oxide, titanium oxide, tantalum oxide or zinc oxide.

The data conductive layer 150 is disposed on the third insulating layer 123. The data conductive layer 150 may include a first electrode SD1 and a second electrode SD2 of the TFT of the pixel PX. The first electrode SD1 and the second electrode SD2 of the TFT may be electrically connected to a source region and a drain region of the semiconductor layer 110 through contact holes penetrating the third insulating layer 123, the second insulating layer 122 and the first insulating layer 121. A first power supply voltage electrode ELVDDE of the pixel PX may also include the data conductive layer 150. The first power supply voltage electrode ELVDDE may be electrically connected to the storage capacitor second electrode CE2 through a contact hole penetrating the third insulating layer 123.

In an exemplary embodiment, the data conductive layer 150 may include one or more metals including at least one of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), for example. The data conductive layer 150 may be a single layer or a multilayer. In an exemplary embodiment, the data conductive layer 150 may have a stacked structure of Ti/Al/Ti, Mo/Al/Mo, Mo/AlGe/Mo, or Ti/Cu, for example.

The fourth insulating layer 124 is disposed on the data conductive layer 150. The fourth insulating layer 124 covers the data conductive layer 150. The fourth insulating layer 124 may be a via layer. In an exemplary embodiment, the fourth insulating 124 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene ("BCB").

The anode 160 is disposed on the fourth insulating layer 124. The anode 160 may be a pixel electrode provided in each pixel PX. The first electrode 161 may be electrically connected to the second electrode SD2 of the TFT through a contact hole penetrating the fourth insulating layer 124. The anode 160 may at least partially overlap the light emitting region EMA of the pixel PX.

In an exemplary embodiment, the anode 160 may have, but not limited to, a stacked structure in which a material layer having a high work function such as indium tin oxide ("ITO"), indium zinc oxide ("IZO"), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a combination of the same are stacked. The material layer having a high work function may be disposed on the reflective material layer to be close to the light emitting layer 170. In an exemplary embodiment, the anode 160 may have a multilayer structure of, but not limited to, ITO/Mg, ITO/MgF, ITO/Ag, or ITO/Ag/ITO, for example.

The bank layer 126 may be disposed on the anode 160. The bank layer 126 may be disposed on the anode 160 and may include an opening exposing the anode 160. The light emitting region EMA and the non-light emitting region NEM may be distinguished from each other by the bank layer 126 and the opening of the bank layer 126. In an exemplary embodiment, the bank layer 126 may include an organic insulating material such as polyacrylates resin, epoxy resin, phenolic resin, polyamides resin, polyimides resin, unsaturated polyesters resin, polyphenylenethers resin, polyphenylenesulfides resin or BCB. The bank layer 126 may also include an inorganic material.

A spacer 127 may be disposed on the bank layer 126. The spacer 127 may be disposed directly on the bank layer 126. The spacer 127 may overlap the bank layer 126 in the thickness direction. The spacer 127 may maintain a gap between the bank layer 126 and a structure disposed on the spacer 127. In an exemplary embodiment, the spacer 127 may prevent a fine metal mask ("FMM") from sagging when an organic material of the light emitting layer 170 is deposited through the FMM, for example. In some cases, the spacer 127 may support a structure stacked on the spacer 127 or may reduce deformation due to stress when the display panel 10 is pressed. The spacer 127 may be narrower than the bank layer 126. The spacer 127 may be disposed only on a portion of the bank layer 126, thus causing a step difference from a portion where the spacer 127 is not present.

The spacer 127 may include an organic insulating material, like the bank layer 126. The spacer 127 may include a different layer from the bank layer 126, but may also include the same material as that of the bank layer 126 through a single process. In an exemplary embodiment, the bank layer 126 and the spacer 127 may be provided to have different heights in a single process by applying a photosensitive organic material and then exposing and developing the photosensitive organic material using a slit mask or a halftone mask, for example.

The light emitting layer 170 is disposed on the anode 160 exposed by the bank layer 126. The light emitting layer 170 may include an organic material layer. The organic material layer of the light emitting layer 170 may include an organic light emitting layer and may further include a hole injection/transport layer and/or an electron injection/transport layer.

The cathode 180 may be disposed on the light emitting layer 170. The cathode 180 may be a common electrode disposed entirely without distinction between pixels. The anode 160, the light emitting layer 170, and the cathode 180 may form an organic light emitting element.

The cathode 180 may contact not only the light emitting layer 170 but also an upper surface of the bank layer 126. In addition, in a region where the spacer 127 is provided, the cathode 180 may contact a surface of the spacer 127 and cover the surface of the spacer 127. The cathode 180 may be provided in a conformal manner along a structure disposed under the cathode 180 so as to reflect a step of the structure.

In an exemplary embodiment, the cathode 180 may include a material layer having a small work function, such as Li, Ca, LiF/Ca, LiF/Al, Al, Mg, Ag, Pt, Pd, Ni, Au, Nd, Ir, Cr, BaF, Ba, or a compound or combination of the same (e.g., a combination of Ag and Mg). The cathode 180 may further include a transparent metal oxide layer disposed on the material layer having a small work function.

The thin-film encapsulation layer 190 including a first inorganic layer 191, a first organic layer 192, and a second inorganic layer 193 is disposed on the cathode 180. The first inorganic layer 191 and the second inorganic layer 193 may contact each other at an end of the thin-film encapsulation layer 190 (refer to FIG. 7). The first organic layer 192 may be sealed by the first inorganic layer 191 and the second inorganic layer 193.

In an exemplary embodiment, each of the first inorganic layer 191 and the second inorganic layer 193 may include silicon nitride, silicon oxide, or silicon oxynitride, for example. In an exemplary embodiment, the first organic layer 192 may include an organic insulating material such as polyacrylates resin, epoxy resin phenolic resin, polyamides resin, polyimides resin, unsaturated polyesters resin, polyphenylenethers resin, polyphenylenesulfides resin or BCB.

The touch layer TSP may be disposed on the thin-film encapsulation layer 190. The touch layer TSP may include a touch base layer 205, a first touch conductive layer 210, a first touch insulating layer 215, a second touch conductive layer 220, and a second touch insulating layer 230 sequentially stacked on the thin-film encapsulation layer 190. Any one (e.g., the second touch conductive layer 220) of the first touch conductive layer 210 and the second touch conductive layer 220 may form a mesh electrode constituting a touch sensing electrode, and the other one (e.g., the first touch conductive layer 210) may serve as a connection electrode for connecting adjacent touch sensing electrodes. The first touch conductive layer 210 and the second touch conductive layer 220 may overlap the bank layer 126 and may be disposed in the non-light emitting region NEM. Since the first touch conductive layer 210 and the second touch conductive layer 220 do not overlap the light emitting region EMA, even when they include an opaque metal, they may not substantially reduce the luminance of the display device 1 and may not be visible to a user.

The touch base layer 205 of the touch layer TSP may include an inorganic insulating material. In an exemplary embodiment, the touch base layer 205 may include a silicon nitride layer, a silicon oxynitride layer, a silicon oxide layer, a titanium oxide layer, or an aluminum oxide layer, for example. In some exemplary embodiments, the touch base layer 205 may be replaced with the second inorganic layer 193 constituting the thin-film encapsulation layer 190.

Each of the first touch conductive layer 210 and the second touch conductive layer 220 may include a metal or a transparent conductive layer. The metal may include aluminum, titanium, copper, molybdenum, silver, or an alloy of the same. In an exemplary embodiment, the transparent conductive layer may include a transparent conductive oxide such as ITO, IZO, zinc oxide (ZnO) or indium tin zinc oxide ("ITZO"), a conductive polymer such as PEDOT, metal nanowires, graphene, etc. As described above, when the first touch conductive layer 210 and the second touch conductive layer 220 are disposed in the non-light emitting region NEM, they may not interfere with the propagation of emitted light even when they include an opaque metal with low resistivity.

The first touch conductive layer 210 and/or the second touch conductive layer 220 may include a multilayered conductive layer. In an exemplary embodiment, the first touch conductive layer 210 and/or the second touch conductive layer 220 may have a three-layer structure of titanium/aluminum/titanium, for example.

The first touch insulating layer 215 and the second touch insulating layer 230 may include an inorganic material or an organic material. In an exemplary embodiment, any one of the first touch insulating layer 215 and the second touch insulating layer 230 may include an inorganic material, and the other one may include an organic material. In an exemplary embodiment, the first touch insulating layer 215 may include a silicon nitride layer, a silicon oxynitride layer, a silicon oxide layer, a titanium oxide layer or an aluminum oxide layer, and the second touch insulating layer 230 may include at least any one of acrylic resin, methacrylic resin, polyisoprene, vinyl resin, epoxy resin, urethane resin, cellulose resin, siloxane resin, polyimide resin, polyamide resin, and perylene resin, for example.

The touch layer TSP may further include a light shielding pattern 240 and an overcoat layer 250 disposed on the second touch insulating layer 230.

The light shielding pattern 240 may be disposed on the second touch insulating layer 230. The light shielding pattern 240 may reduce the reflection of external light and improve the feeling of color of reflected light. The light shielding pattern 240 is disposed in the non-light emitting region NEM. In an exemplary embodiment, the light shielding pattern 240 may have a lattice shape or a mesh shape in a plan view, for example. The light shielding pattern 240, the touch conductive layers 210 and 220, and the bank layer 126 may all be disposed in the non-light emitting region NEM and may overlap each other in the thickness direction. A width of the light shielding pattern 240 may be smaller than or equal to a width of the bank layer 126 and greater than widths of the touch conductive layers 210 and 220. The light shielding pattern 240 may not overlap the light emitting region EMA.

The overcoat layer 250 is disposed on the light shielding pattern 240. The overcoat layer 250 may be disposed directly on the light shielding pattern 240. The overcoat layer 250 may serve to protect the light shielding pattern 240 by covering the light shielding pattern 240. In an exemplary embodiment, the overcoat layer 250 may further serve to planarize the surface.

In another exemplary embodiment, the light shielding pattern 240 and/or the overcoat layer 250 described above may be omitted.

The polarizing bonding layer PLA is disposed on the overcoat layer 250, and the polarizing member POL is disposed on the polarizing bonding layer PLA. The polarizing member POL may include a polarizing film 260. The polarizing film 260 may be attached onto the touch layer TSP by the polarizing bonding layer PLA including an adhesive or the like.

The polarizing film 260 may include a polarizing layer 263 and protective members 261 and 262 which sandwich the polarizing layer 263 from above and below. The polarizing layer 263 may include a polyvinyl alcohol film. The polarizing layer 263 may be stretched in one direction. The stretching direction of the polarizing layer 263 may be an absorption axis, and a direction perpendicular to the stretching direction may be a transmission axis. The protective members 261 and 262 may be disposed on a surface and the other surface of the polarizing layer 263, respectively. In an exemplary embodiment, the protective members 261 and 262 may include, but not limited to, cellulose resin, such as triacetyl cellulose, or polyester resin.

The transparent bonding layer 30 is disposed on the polarizing member POL, that is, the polarizing film 260, and the window member 20 is disposed on the transparent bonding layer 30. Since the transparent bonding layer 30 and the window member 20 have been described above in detail, a redundant description thereof is omitted.

Figure 7:
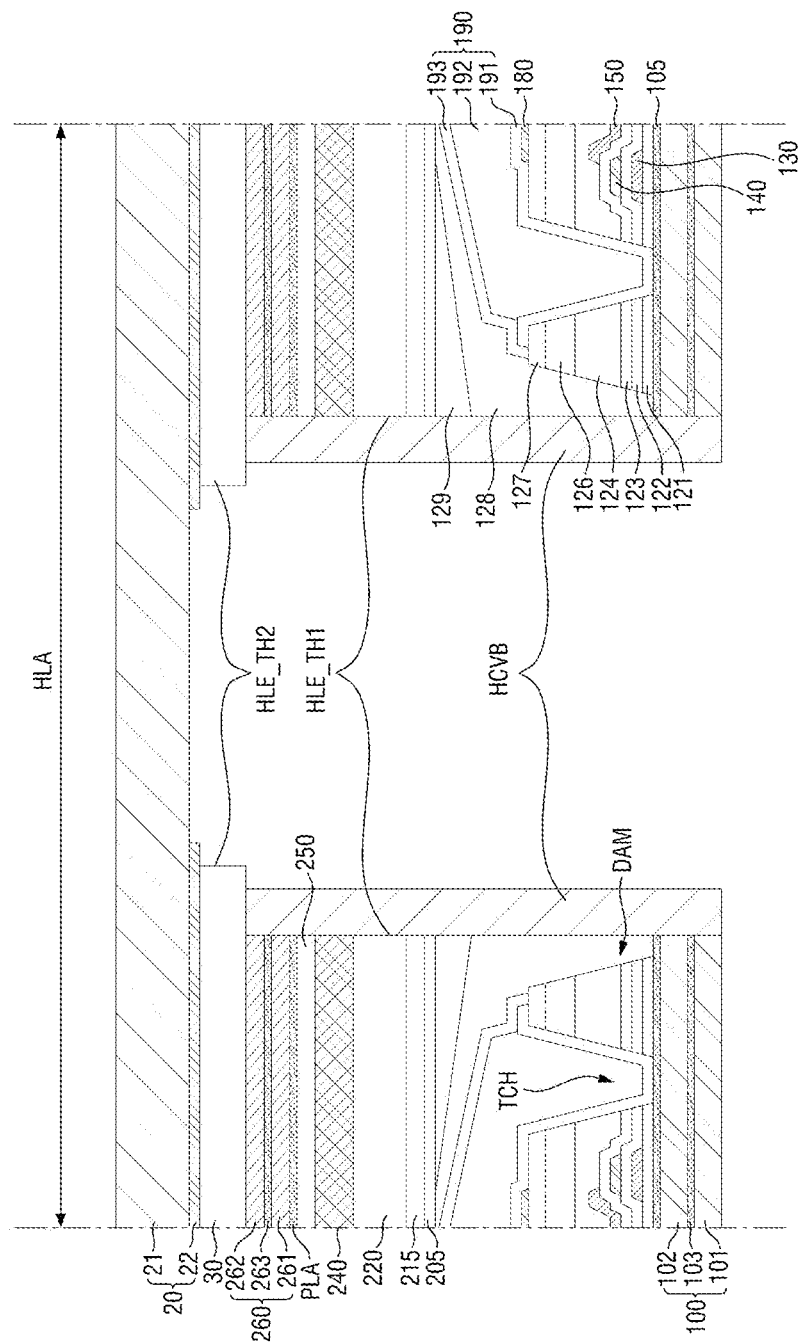
FIG. 7 is a cross-sectional view around the hole region of the display device of FIG. 6.

FIG. 7 is a cross-sectional view around the hole region HLA of the display device 1 of FIG. 6.

Referring to FIGS. 6 and 7, the first through hole HLE_TH1 may penetrate the substrate 100, organic layers 128 and 129 disposed on the substrate 100, the touch layer TSP, the polarizing bonding layer PLA, and the polarizing film 260. Inner walls of the layers constituting the first through hole HLE_TH1 may be aligned with each other.

A dam structure DAM may be disposed around the first through hole HLE_TH1. The dam structure DAM may include the stacked insulating layers 105, 121, 122, 123, 124, 126 and 127. A groove TCH defined by removing the insulating layers 105, 121, 122, 123, 124 and 126 and the metal layers 130, 140, 150, 160 and 180 except for the substrate 100 may be disposed between the dam structure DAM and the pixel PX. At least a portion of the thin-film encapsulation layer 190 may be disposed in the groove TCH. In an exemplary embodiment, the first organic layer 192 of the thin-film encapsulation layer 190 may extend up to the dam structure DAM and may not be disposed in the hole region HLA beyond the dam structure DAM, for example. That is, the dam structure DAM may prevent the first organic layer 192 from overflowing to the hole region HLA. The first inorganic layer 191 or the second inorganic layer 193 of the thin-film encapsulation layer 190 may further extend beyond the dam structure DAM. Although the first inorganic layer 191 and the second inorganic layer 193 do not extend to the first through hole HLE_TH1 but end on the dam structure DAM before the first through hole HLE_TH1 in the drawing, the invention is not limited to this case.

The thin-film encapsulation layer 190 around the hole region HLA may slope downward toward the first through hole HLE_TH1. One or more organic layers 128 and 129 may be further disposed on the thin-film encapsulation layer 190 in order to planarize an inclined surface around the hole region HLA. In an exemplary embodiment, a second organic layer 128 may be disposed on the first organic layer 192, and a third organic layer 129 may be disposed on the second organic layer 128, for example. The second organic layer 128 and the third organic layer 129 may planarize an inclined step around the hole region HLA by filling the inclined step. In an exemplary embodiment, the second organic layer 128 and the third organic layer 129 may be exposed to the first through hole HLE_TH1 and may constitute the inner wall of the first through hole HLE_TH1. Accordingly, the inner wall of the first through hole HLE_TH1 may be composed of respective side surfaces of the substrate 100, the buffer layer 105, the second organic layer 128, the third organic layer 129, the touch base layer 205, the first touch insulating layer 215, the second touch insulating layer 230, the overcoat layer 250, the polarizing bonding layer PLA, and the polarizing film 260. The inner wall of the first through hole HLE_TH1 may be covered by the hole coating layer HCVB as described above.

A method of manufacturing the exemplary embodiment of the display device 1 of FIG. 3 will now be described.

FIGS. 8 through 11 are cross-sectional views illustrating an exemplary embodiment of steps of a method of manufacturing a display device.

Figure 8:
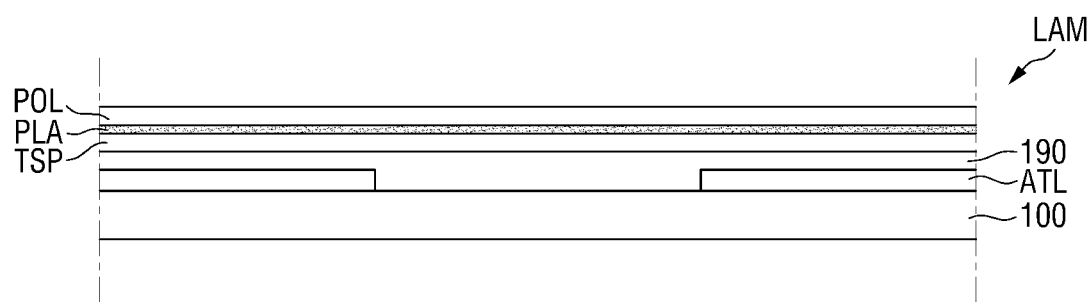
FIGS. 8 through 11 are cross-sectional views illustrating an exemplary embodiment of steps of a method of manufacturing a display device.

Referring to FIG. 8, first, a laminate LAM of a display panel 10 and a polarizing member POL is prepared. The laminate LAM may be provided by attaching the polarizing member POL onto a surface of the display panel 10 using a method such as lamination.

Figure 9:
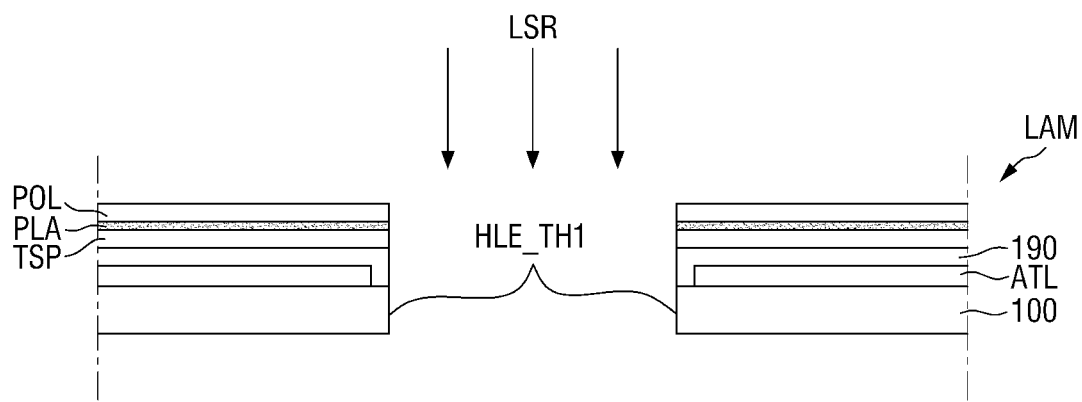

Referring to FIG. 9, a first through hole HLE_TH1 is defined in a hole region HLA of the laminate LAM. The first through hole HLE_TH1 may be defined using, e.g., a laser LSR. The first through hole HLE_TH1 physically penetrates the display panel 10 and the polarizing member POL in the thickness direction. Since a through hole of the display panel 10 and a through hole of the polarizing member POL are defined in the same process, their inner walls may be aligned with each other, and their inner diameters may be the same.

As a result of forming the first through hole HLE_TH1, the display panel 10 and the polarizing member POL may be exposed toward an inner wall of the first through hole HLE_TH1. In the case of the display panel 10, a region where the first through hole HLE_TH1 is defined may be finished with an encapsulation structure (refer to '190' in FIG. 7), a groove TCH and a dam structure DAM as described above with reference to FIG. 7. Therefore, it is possible to prevent propagation of cracks and permeation of moisture or outside air into an active region AAR. In the case of the polarizing member POL provided as a film, it is difficult to have a different structure in each region, and the active region may be directly exposed by physical penetration. Since the polarizing member POL may discolor or locally shrink when exposed to moisture as described above, the inner wall of the first through hole HLE_TH1 may be coated with a hole coating layer HCVB in a subsequent process.

The hole coating layer HCVB may be provided not only on the exposed inner wall of the polarizing member POL but also on the inner wall of the display panel 10 laminated together with the polarizing member POL. It may be easier to form the hole coating layer HCVB on both the inner wall of the polarizing member POL and the inner wall of the display panel 10 than to form the hole coating layer HCVB only on the inner wall of the polarizing member POL. In addition, when the hole coating layer HCVB is defined also on the inner wall of the display panel 10, unnecessary steps inside the first through hole HLE_TH1 may be reduced, permeation of moisture or the like into the active region AAR of the display panel 10 may be prevented.

Figure 10A:
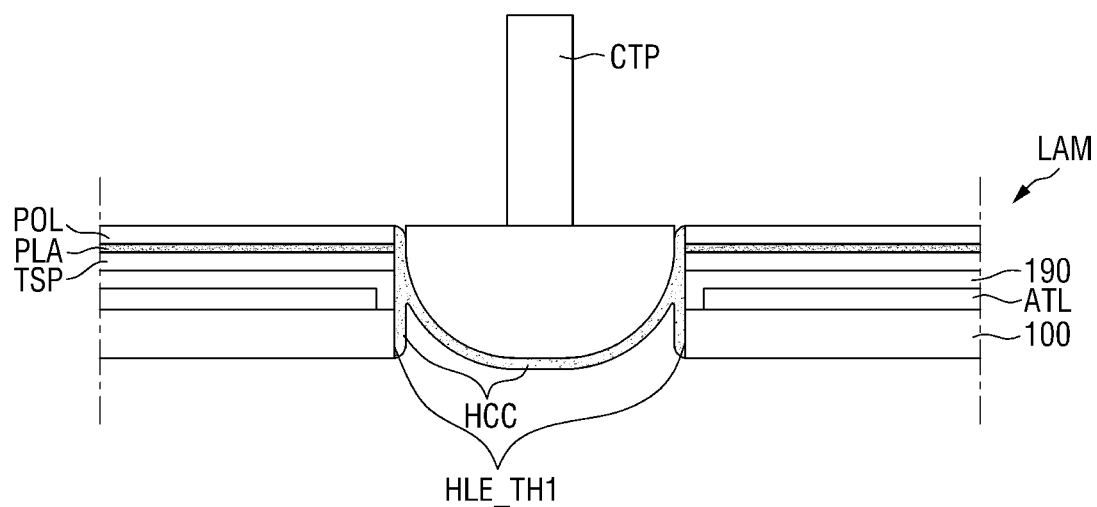
Figure 10B:
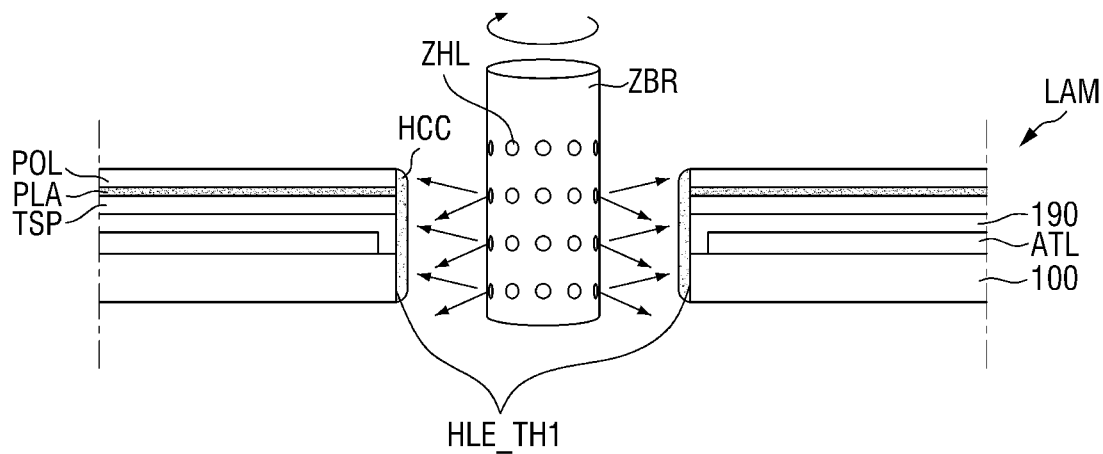
Figure 10C:
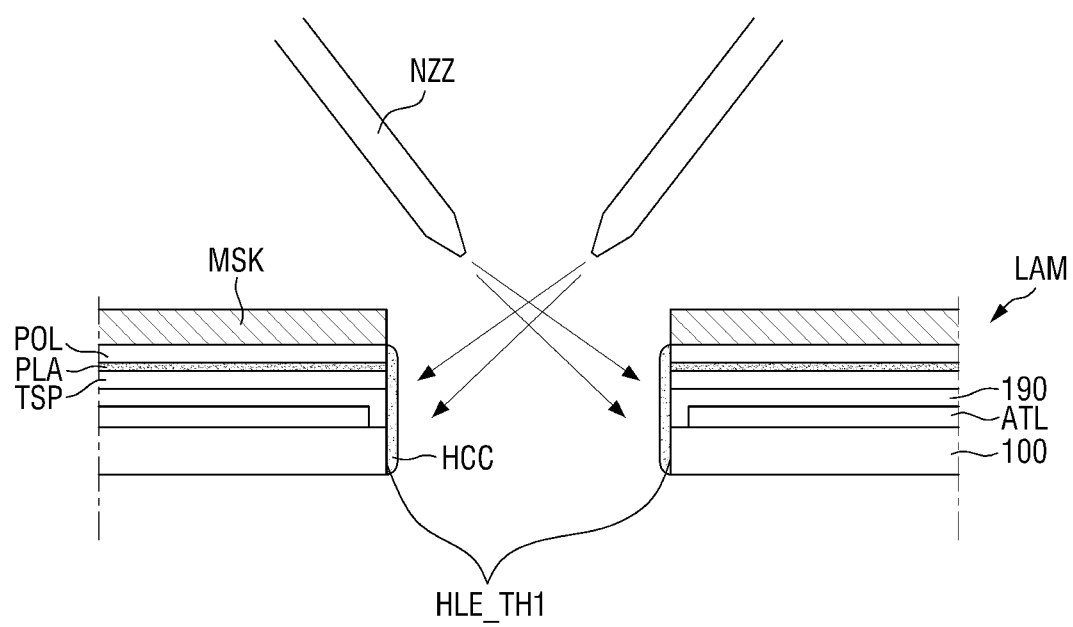

FIGS. 10A through 10C illustrate methods of forming the hole coating layer HCVB according to various embodiments.

In an exemplary embodiment, the hole coating layer HCVB may be provided in a contact coating manner as illustrated in FIG. 10A. Specifically, the inner wall of the first through hole HLE_TH1 may be coated with a coating layer composition HCC by smearing the coating layer composition HCC onto a contact pad CTP including a silicon pad, inserting the contact pad CTP into the first through hole HLE_TH1, and then smearing or transferring the coating layer composition HCC onto the inner wall of the first through hole HLE_TH1.

In an exemplary embodiment, the hole coating layer HCVB may be provided in a contactless coating manner as illustrated in FIG. 10B. Specifically, a spray bar ZBR including one or more spray holes ZHL in its side surface is inserted into the first through hole HLE_TH1. Then, the spray bar ZBR is rotated to spray the coating layer composition HCC through the spray holes ZHL, thereby coating the inner wall of the first through hole HLE_TH1 with the coating layer composition HCC.

In an exemplary embodiment, the hole coating layer HCVB may be provided as illustrated in FIG. 10C. Specifically, the inner wall of the first through hole HLE_TH1 may be coated with the coating layer composition HCC by placing a mask MSK, which exposes the first through hole HLE_TH1, on or above a surface of the laminate LAM (a surface of the polarizing member POL) and spraying the coating layer composition HCC into the first through hole HLE_TH1 using a spray nozzle NZZ.

The coating layer composition HCC coated using a method such as those of FIGS. 10A through 10C may be dried and/or cured into the hole coating layer HCVB. In an exemplary embodiment, the curing of the coating layer composition HCC may be achieved by, but not limited to, ultraviolet curing and/or heat curing.

When the hole coating layer HCVB is disposed on the inner wall of the first through hole HLE_TH1 of the laminate LAM using the above method, an inner diameter of the first through hole HLE_TH1 of the laminate LAM may be reduced by a thickness of the hole coating layer HCVB.

Figure 11:
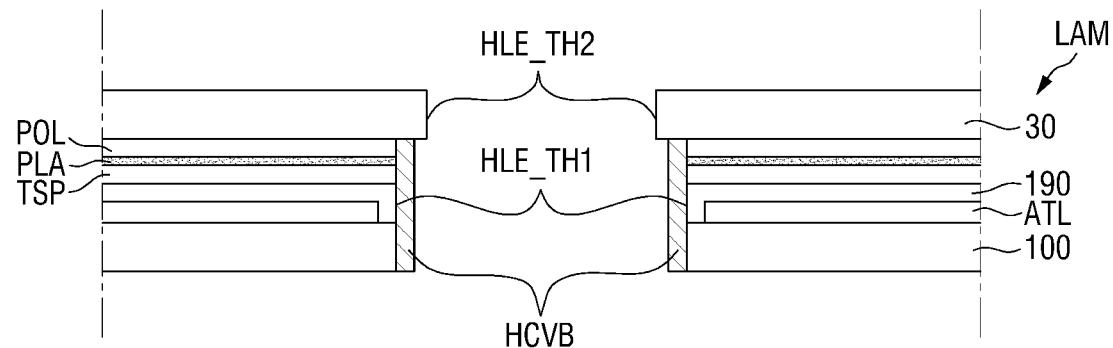

Referring to FIG. 11, a transparent bonding layer 30 is attached onto the laminate LAM including the hole coating layer HCVB. The attachment of the transparent bonding layer 30 may be achieved by lamination or coating. A second through hole HLE_TH2 may be defined in the transparent bonding layer 30 attached such that the second through hole HLE_TH2 is positioned inside the first through hole HLE_TH1 of the laminate LAM in a plan view. The transparent bonding layer 30 in which the second through hole HLE_TH2 is defined may be attached onto the laminate LAM, but the second through hole HLE_TH2 may also be defined in a state where the transparent bonding layer 30 is attached onto the laminate LAM.

Next, referring to FIG. 3, a window member 20 is attached onto the transparent bonding layer 30. The window member 20 includes a pattern of a print layer 22 defining an optical hole HLE_OP. The optical hole HLE_OP may overlap the first through hole HLE_TH1 of the laminate LAM and the second through hole HLE_TH2 of the transparent bonding layer 30. The optical hole HLE_OP may have a smaller inner diameter than the first through hole FILE TH1 of the laminate LAM and/or the second through hole HLE_TH2 of the transparent bonding layer 30 and may be located inside the first through hole HLE_TH1 and/or the second through hole HLE_TH2.

Although the window member 20 is attached after the transparent bonding layer 30 is attached to the laminate LAM in the above-described embodiment, the transparent bonding layer 30 may first be attached to the window member 20, and then the window member 20 including the transparent bonding layer 30 may be attached to the laminate LAM in an exemplary embodiment. In an alternative exemplary embodiment, the transparent bonding layer 30 and the window member 20 may be laminated simultaneously.

Figure 12:
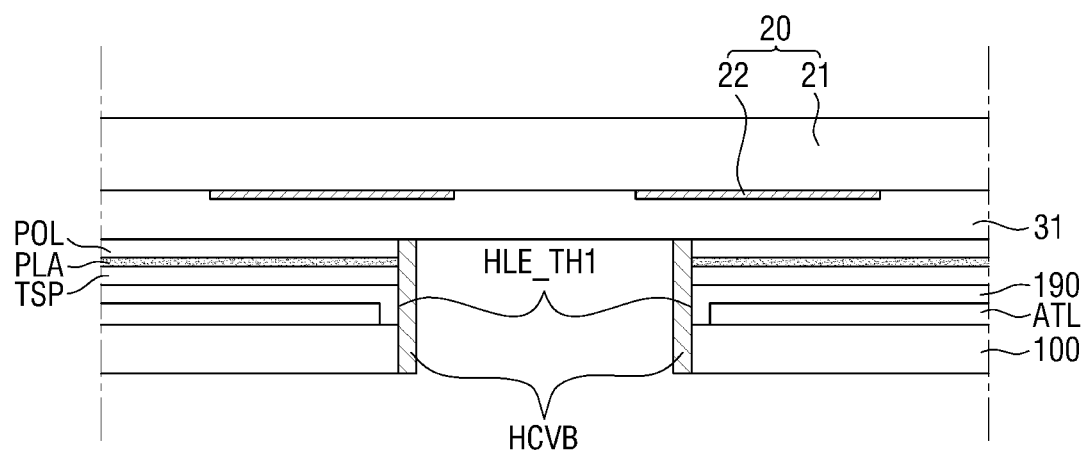
FIG. 12 is a cross-sectional view around an exemplary embodiment of a hole region of a display device.

Hereinafter, other exemplary embodiments will be described. FIG. 12 is a cross-sectional view around an exemplary embodiment of a hole region HLA of a display device.

Referring to FIG. 12, the illustrated exemplary embodiment of the display device is different from the exemplary embodiment of FIG. 3 in that a transparent bonding layer 31 does not include a second through hole HLE_TH2. Since the transparent bonding layer 31 itself has high light transmittance, even when the transparent bonding layer 31, like a window base 21, covers the hole region HLA, it may pass external light so that the external light may reach a light receiving portion of an optical element OPS. The light transmittance of the optical hole HLE_OP may be somewhat reduced as compared with the exemplary embodiment of FIG. 3, but it may be more advantageous for maintaining a uniform light transmittance inside the optical hole HLE_OP because there is no alignment issue between the second through hole HLE_TH2 of the transparent bonding layer 31 and a first through hole HLE_TH1 of a laminate LAM of a display panel 10 and a polarizing member POL.

Figure 13:
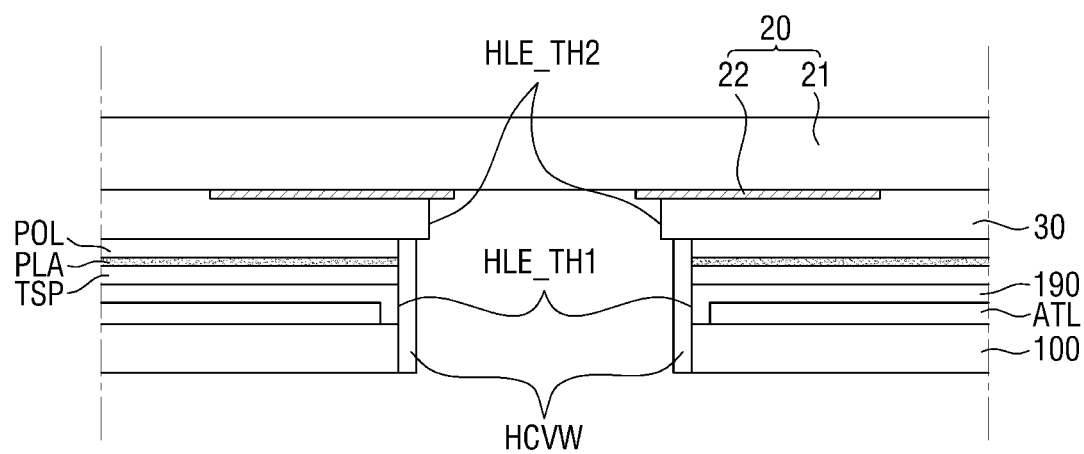
FIG. 13 is a cross-sectional view around an exemplary embodiment of a hole region of a display device.

FIG. 13 is a cross-sectional view around an exemplary embodiment of a hole region of a display device.

Referring to FIG. 13, the illustrated exemplary embodiment of the display device is different from the exemplary embodiment of FIG. 3 in that a hole coating layer HCVW includes clear resin. When the hole coating layer HCVW is transparent, it is difficult for the hole coating layer HCVW to perform the function of preventing the leakage of light by itself. However, the light leakage prevention function may be supplemented by fully covering a through hole HLE with a pattern of a print layer 22 of a window member 20. In this regard, in the illustrated exemplary embodiment, the print layer 22 may overlap the hole coating layer HCVW in the thickness direction and may completely cover the hole coating layer HCVW.

Figure 14:
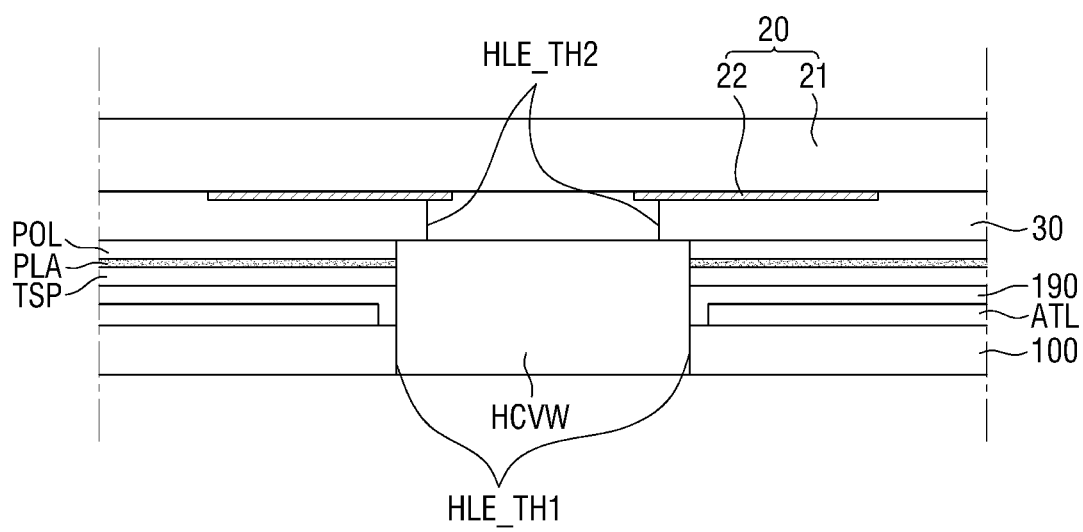
FIGS. 14 and 15 are cross-sectional views of exemplary embodiments of hole regions of display devices.
Figure 15:
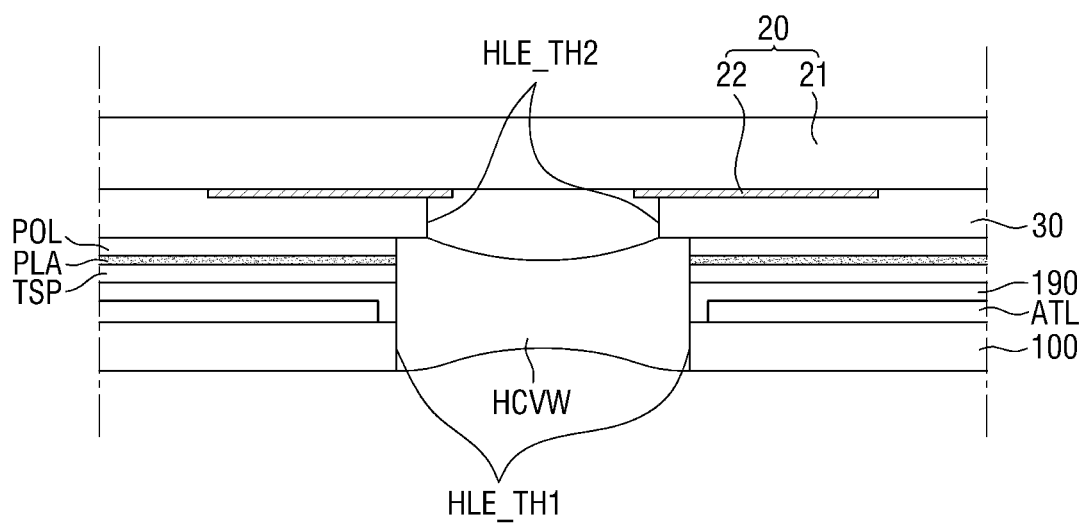

FIGS. 14 and 15 are cross-sectional views of exemplary embodiments of hole regions of display devices.

The exemplary embodiments of FIGS. 14 and 15 show that a hole coating layer HCVW not only covers an inner wall of a first through hole HLE_TH1 of a laminate LAM of a display panel 10 and a polarizing member POL but also fills the first through hole HLE_TH1. In this case, the hole coating layer HCVW may include a transparent material in order to secure an optical hole HLE_OP.

In an exemplary embodiment, referring to FIG. 14, a thickness of the hole coating layer HCVW may be substantially the same as a thickness of the laminate LAM and may be uniform overall. In the exemplary embodiment of FIG. 14, a surface and the other surface of the hole coating layer HCVW may be flat and may be substantially parallel to each other.

In an exemplary embodiment, referring to FIG. 15, the thickness of the hole coating layer HCVW may be maximum in a region adjacent to an inner wall of the laminate LAM and may be reduced toward a center. In the exemplary embodiment of FIG. 15, a surface and/or the other surface of the hole coating layer HCVW may include a concave surface.

Figure 16:
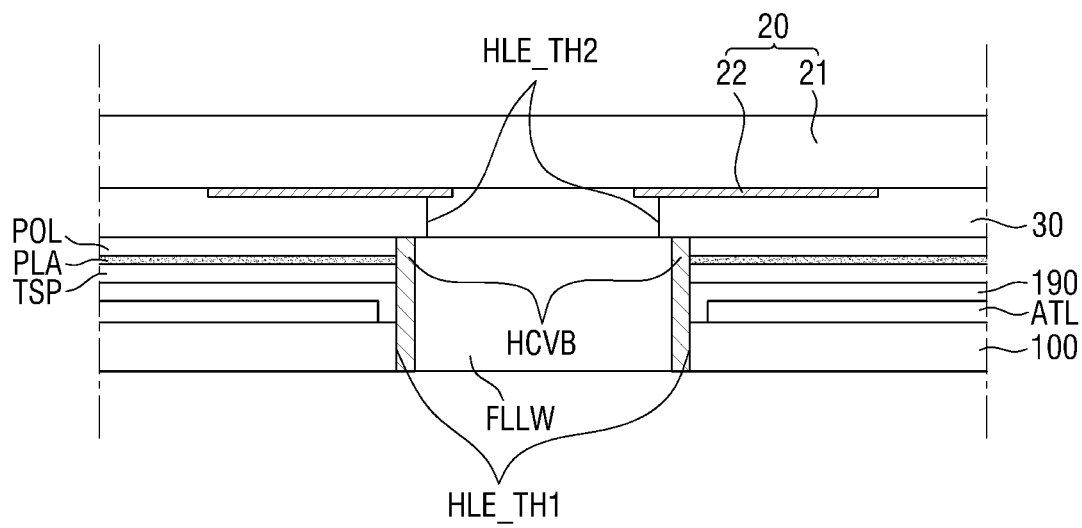
FIG. 16 is a cross-sectional view around an exemplary embodiment of a hole region of a display device.

FIG. 16 is a cross-sectional view around an exemplary embodiment of a hole region of a display device.

The exemplary embodiment of FIG. 16 shows that the display device may include both a hole coating layer HCVB and a filler FLLW in a first through hole HLE_TH1. Specifically, an inner wall of the first through hole HLE_TH1 may be covered with the hole coating layer HCVB, and a space defined by the hole coating layer HCVB may be filled with the filler FLLW. The filler FLLW may contact the hole coating layer HCVB. The hole coating layer HCVB may include a black material as in the exemplary embodiment of FIG. 3 or a transparent material as in the exemplary embodiment of FIG. 13. The filler FLLW may include a transparent material.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device including an active region and a non-active region, the display device comprising:
   a display panel including thin-film transistors for driving light emitting elements; and
   a polarizing member which is disposed on a first surface of the display panel,
   wherein a first through hole which penetrates the display panel and the polarizing member in a thickness direction is defined in the display panel and the polarizing member,
   a hole coating layer is disposed directly on a polarizing member's inner wall that defines the first through hole,
   the hole coating layer is disposed in a same layer as the thin-film transistors in a cross-sectional view, and
   the display panel is disposed in a different layer from the polarizing member in the cross-sectional view.

2. The display device of claim 1, wherein the hole coating layer is further disposed on an inner wall of the display panel of the first through hole.

3. The display device of claim 2, wherein the hole coating layer has a uniform thickness in the thickness direction.

4. The display device of claim 1, wherein the hole coating layer comprises black resin.

5. The display device of claim 1, wherein the hole coating layer comprises clear resin.

6. The display device of claim 5, wherein the hole coating layer fills the first through hole.

7. The display device of claim 1, further comprising a transparent filler which is disposed on the hole coating layer and fills the first through hole.

8. The display device of claim 7, wherein the hole coating layer comprises black resin.

9. The display device of claim 1, further comprising an optical element which is disposed on a second surface of the display panel and overlaps the first through hole.

10. The display device of claim 1, further comprising a window member which is disposed on a surface of the polarizing member, wherein the window member comprises a window base and a print layer which is disposed on the window base, overlaps the first through hole, and at least partially exposes the first through hole.

11. The display device of claim 10, wherein an inner side surface of the print layer protrudes inward from the first through hole, and the hole coating layer overlaps the print layer.

12. The display device of claim 11, wherein the inner side surface of the print layer protrudes inward from the hole coating layer.

13. The display device of claim 1, wherein the first through hole is defined in the active region and surrounded by the active region.

14. The display device of claim 13, wherein the first through hole is the non-active region.

15. The display device of claim 1, further comprising:
   a window member which is disposed on a surface of the polarizing member; and
   a transparent bonding layer which is interposed between the polarizing member and the window member.

16. The display device of claim 15, wherein a second through hole which penetrates the transparent bonding layer in the thickness direction and overlaps the first through hole is defined in the transparent bonding layer.

17. The display device of claim 16, wherein an inner wall of the second through hole protrudes inward from an inner wall of the first through hole.

18. A display device including a hole region disposed within an active region, the display device comprising:
   a display panel which comprises a flexible substrate, an active element layer disposed on the flexible substrate and comprising light emitting elements, and a thin-film encapsulation layer disposed on the active element layer;
   a polarizing bonding layer which is disposed on the thin-film encapsulation layer of the display panel;
   a polarizing film which is disposed on the polarizing bonding layer;
   a transparent bonding layer which is disposed on the polarizing film; and
   a window member which is disposed on the transparent bonding layer and comprises a window base and a print layer disposed on the window base;
   wherein
   a first through hole which penetrates the flexible substrate, the active element layer, the thin-film encapsulation layer, the polarizing bonding layer and the polarizing film in a thickness direction is defined in the hole region;

the hole region comprises a hole coating layer which is disposed on an inner wall of the first through hole;
a second through hole which penetrates the transparent bonding layer in the thickness direction and overlaps the first through hole is defined in the hole region; and
an optical hole is defined by the print layer and overlaps the first through hole and the second through hole.

19. The display device of claim 18, wherein the display panel further comprises a dam structure disposed around the hole region.

20. The display device of claim 18, wherein the display panel further comprises a touch layer which is disposed on the thin-film encapsulation layer and through which the first through hole passes.

* * * * *